United States Patent [19]

Dominick et al.

[11] Patent Number: 4,555,681

[45] Date of Patent: Nov. 26, 1985

[54] IMPROVED, LOW-DISTORTION, BROADBAND DIRECTIONAL COUPLER FORMED BY MULTIPLE SERIES TRANSFORMERS

[75] Inventors: Thomas S. Dominick, Glen Burnie; Roy G. Anderson, Baltimore, both of Md.

[73] Assignee: Westinghouse Electric Corp., Pittsburgh, Pa.

[21] Appl. No.: 636,774

[22] Filed: Aug. 1, 1984

[51] Int. Cl.[4] .............................................. H03H 7/00
[52] U.S. Cl. ..................................... 333/112; 333/119
[58] Field of Search ................ 333/112, 118, 119, 131

[56] References Cited

U.S. PATENT DOCUMENTS

| | | | |
|---|---|---|---|
| 2,909,733 | 10/1959 | Walter | 333/119 |
| 3,048,798 | 8/1962 | Simons | 333/112 |
| 3,559,110 | 1/1971 | Wiley et al. | 333/112 |
| 3,624,536 | 11/1971 | Norton . | |
| 3,872,408 | 3/1975 | Reilly . | |
| 4,121,180 | 10/1978 | Greenway . | |
| 4,311,974 | 1/1982 | Reddy . | |

Primary Examiner—Paul Gensler
Attorney, Agent, or Firm—W. G. Sutcliff

[57] ABSTRACT

A high frequency directional coupler having improved intermodulation distortion performance is disclosed. The coupler includes input, output, reflected, and incident ports, and current and voltage transformers. The current transformer includes at least one primary winding connected between the inlet and outlet ports and at least one secondary winding coupled with the primary winding and connected between the reflected port and ground. The voltage transformer includes a plurality of series-connected primary windings connected between the reflected and incident ports, and a plurality of series-connected secondary windings coupled with said voltage transformer primary windings, respectively, and connected between the input port and ground. Shunt capacitors connected with the input, output, reflected and incident ports increase the bandwidth of the coupler.

6 Claims, 6 Drawing Figures

IMPROVED, LOW-DISTORTION, BROADBAND DIRECTIONAL COUPLER FORMED BY MULTIPLE SERIES TRANSFORMERS

The Department of the Navy has rights in this invention pursuant to Contract No. N00014-82-C-2067.

BACKGROUND OF THE INVENTION

The present invention relates to a directional coupler for use in the high frequency (HF) band between 2 and 30 MHz, characterized by improved intermodulation performance and increased bandwidth.

BRIEF DESCRIPTION OF THE PRIOR ART

Directional couplers are well-known in the patented prior art as evidenced by the patents to Norton U.S. Pat. No. 3,624,536, Reilly U.S. Pat. No. 3,872,408, Greenway U.S. Pat. No. 4,121,180, and Reddy U.S. Pat. No. 4,311,974. As shown therein, directional couplers commonly include current and voltage sensing transformers which typically have 1 to N turns ratio to sample fractional amounts of a radio frequency signal. In order for the coupler to achieve high frequency performance, it is necessary to maintain the lengths of the transformer windings as short as possible because the shunt capacity and the series leakage inductance associated with a winding increase as the winding length increases and thus limits high frequency response. In order to keep the winding lengths short, the transformers are wound on high permeability ferrite cores and the energy is transferred by the resulting magnetic field through the ferrite medium. Ferrite, however, is a non-linear material and produces intermodulation distortion when driven with multiple tones. The distortion is essentially a function of the type of ferrite material used, the flux density in the core, and the ratio of the signal current to the magnetizing current required by the ferrite material.

The present invention was developed to overcome the above and other drawbacks of the prior directional couplers by providing a high frequency coupler having improved intermodulation distortion performance and increased bandwidth.

SUMMARY OF THE INVENTION

Accordingly, it is a primary object of the present invention to provide a high frequency directional coupler including input, output, reflected, and incident ports, a current sensing transformer, and a voltage sensing transformer. The current transformer includes at least one primary winding connected between the input and output ports and at least one secondary winding coupled with the current transformer primary winding and connected between the reflected port and ground. The voltage transformer includes a plurality of series-connected primary windings connected between the reflected and incident ports, and a plurality of series-connected secondary windings coupled with said voltage transformer primary windings, respectively, and connected between said input port and ground, whereby intermodulation distortion of the coupler is improved.

According to a further object of the invention, the current transformer includes a plurality of series-connected primary windings and a plurality of series-connected secondary windings.

According to a more specific object of the invention, the coupler includes first and second capacitors, the first capacitor being connected between the input port and ground and the second capacitor being connected between the output port and ground, thereby to increase the bandwidth of the coupler.

It is another object of the invention to provide the voltage transformer with a plurality of shunting capacitors, connected between the junction of a pair of series-connected primary windings and ground and between the reflected and incident ports and ground, thereby to define a low pass filter structure.

According to yet another object of the invention, the current and voltage transformers of the coupler each include a nickel-zinc ferrite core.

BRIEF DESCRIPTION OF THE FIGURES

Other objects and advantages of the subject invention will become apparent from a study of the following specification when viewed in the light of the accompanying drawing, in which.

DETAILED DESCRIPTION

Figure 1:
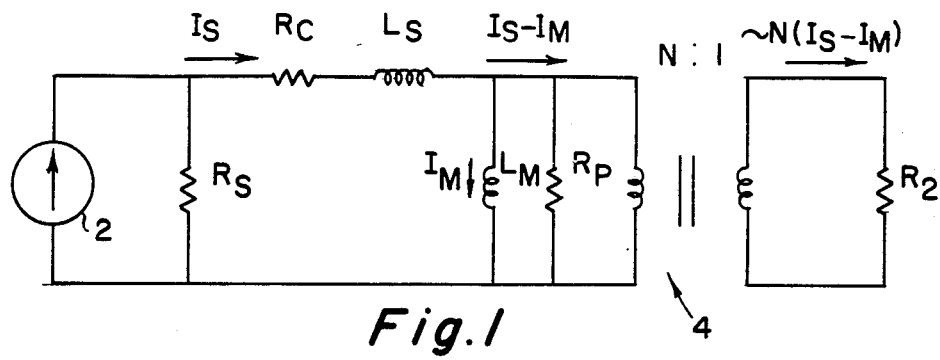
FIG. 1 is an equivalent circuit of a transformer used in a directional coupler.

Referring first to FIG. 1, an equivalent circuit for a transformer commonly used in a directional coupler is shown. The current source 2 having a source resistance $R_S$ produces a current $I_S$ which is transmitted to the load $R_Z$ via the ideal transformer 4 having a turns ratio of N:1. The source current is modified by the non-linear current $I_M$ that flows through a magnetizing inductance $L_M$. Non-linear current also flows through the parallel resistance $R_P$ of the transformer core. At low frequencies where distortion products are greatest, the non-linear current $L_M$ flowing through the magnetizing inductance is much larger and thus is the major contributor to the non-linearity of the transformer. The coil resistance $R_C$ and the leakage inductance $L_S$ are linear elements.

Figure 2:
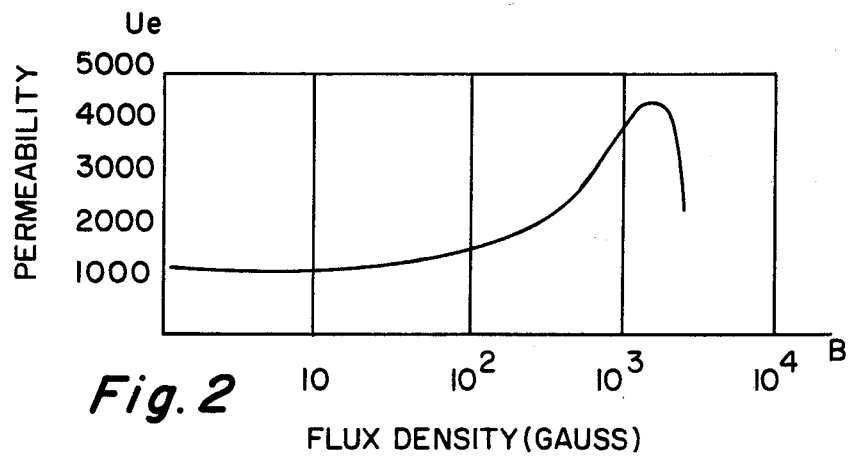
FIG. 2 is a graphical representation of permeability vs. flux density for a common nickel-zinc ferrite material.

FIG. 2 is a graphical representation of permeability versus flux density for a common nickel-zinc ferrite such as Ceramic Magnetic CMD 5005. Nickel-zinc is the ferrite material most suitable for use at high frequency because of its low loss characteristics. It is the change in permeability $U_e$ due to applied flux density B that produces distortion in ferrite materials. As shown by the curve graphically represented in FIG. 2, $U_e$ is small at low flux densities (i.e. B<10 Gauss) and increases as the flux density increases until the ferrite material begins to saturate (at approximately 1000 Gauss). Distortion measurements on various cores have shown that, in general, third order distortion produced by ferrite material increases on a dB per dB basis as flux density increases, and third order products are the dominant distortion in ferrite materials.

The relationship for the flux density B of a transformer is given by $$B \approx (V/nf)$$

where V is the voltage across the winding, f is the frequency, and n is the number of turns of the secondary winding. Worst case distortion occurs at the low frequency band edge since flux density in the ferrite material is proportional to the inverse of frequency, and thus decreases as frequency increases.

The intermodulation distortion requirements for directional couplers for Type II amplifiers generally specify that distortion products at the output port of the coupler be down 120 dB from the carriers when two tones at 1 KW per tone are injected into the input port of the coupler. With prior directional couplers, the best intermodulation distortion performance was −105 dB at 1 KW per tone. The worst case in-band intermodulation distortion product measured was the third order at 2.6 MHz generated from tones at 2 and 2.3 MHz.

Figure 3:
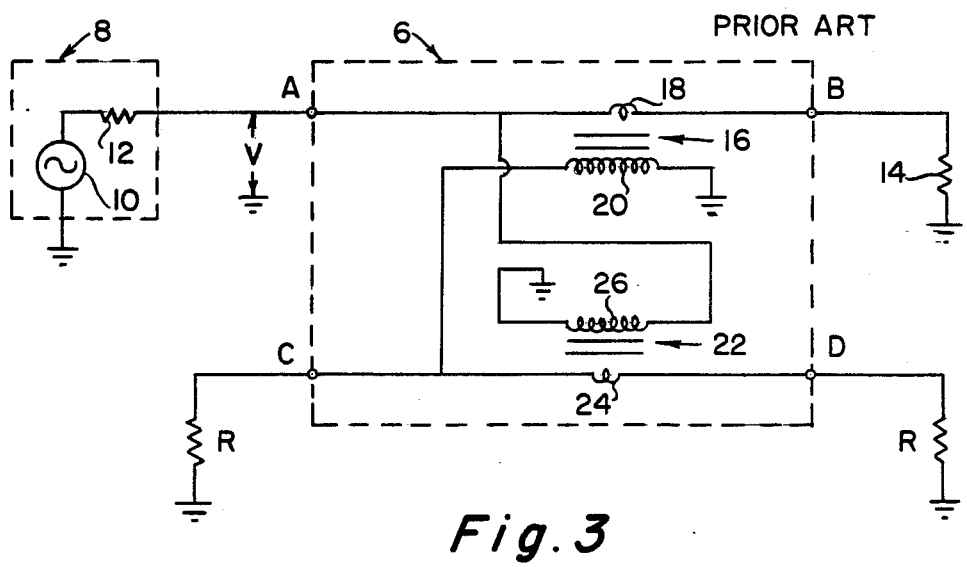
FIG. 3 is a schematic representation of a conventional directional coupler.

A conventional high frequency directional coupler having two ferrite transformers is shown in FIG. 3. The coupler 6 is a four-port network having an input port A, an output port B, a reflected port C, and an incident port D. A power generator 8 including a source 10 and a source resistance 12 is connected with the input port A to produce a voltage V thereacross. A load 14 is connected with the output port B, with resistances R being seen at the reflected and incident ports.

The conventional coupler 6 includes a current transformer 16 having a single turn primary winding 18 and an n turn secondary winding 20. The coupler 6 further includes a voltage transformer 22 also having a single turn primary winding 24 and an n turn secondary winding 26. Most of the power and voltage at the input port A appears at the output port B, with the difference being due to the generally small amount of power coupled out to the incident port D. The ratio of power at the input port A to the power coupled to the incident port D is known as the coupling factor and is controlled by the transformer turns ratio and given by $n^2$ or $10 \log_{10} n^2$ in dB. The high power low distortion couplers required for the Type II amplifier have coupling factors of 20 dB to 30 dB.

The reflected port C of the coupler 6 is isolated from the input port A. The ratio of the power delivered to the incident port D compared to the power at the reflected port C is termed the directivity of the coupler. Directivity for couplers in the HF band (2 to 30 MHz) is normally 35 dB or more. Thus, the isolation between the input port and the reflected port is 35 dB plus the coupling factor.

There are two types of ferrite materials in the HF band, manganese-zinc and nickel-zinc. The most desirable ferrite for use in HF directional couplers is nickel-zinc because of its low loss properties in the HF band. When used in directional couplers, the losses caused by the nickel-zinc ferrite core decrease as the frequency increases, thus compensating somewhat for winding losses that increase with frequency. Manganese-zinc material has much better intermodulation distortion performance but has higher losses at higher frequencies and is thus undesirable in the HF band. The present invention greatly improves the distortion performance of couplers using nickel-zinc ferrite cores.

The main cause of intermodulation distortion in the directional coupler 6 is the magnetizing current in the secondary winding 26 of the voltage transformer 22. As shown in FIG. 3, the entire input voltage V is applied to this winding. Thus, the flux density in the core of the voltage transformer 22 is high and the magnetizing current thereof, which is supplied from the main line, introduces the major distortion. The voltages and flux densities in the current transformer 16 are much lower and thus introduce much less distortion.

The following table presents the voltages and relative flux densities as a function of the transformer turns n ratio for the windings of the current and voltage transformers of the conventional coupler 6 shown in FIG. 3:

| Winding | Voltage | Relative Flux Density |
|---------|---------|----------------------|
| 18 | $\dfrac{V}{2n^4}$ | $\dfrac{V}{2n^4}$ |
| 20 | $\dfrac{V}{2n^3}$ | $\dfrac{V}{2n^4}$ |
| 24 | $\dfrac{V}{n}$ | $\dfrac{V}{n}$ |
| 26 | $\dfrac{V}{n}$ | $\dfrac{V}{n}$ |

The flux density in the voltage transformer 22 could be reduced, and distortion improved, by using a very large core for the transformer. A larger core, however, would require a longer winding length, thereby reducing the high frequency response to less than the required 30 MHz.

The present invention allows directional couplers to be realized with greatly improved intermodulation distortion by substituting a plurality of series-connected transformers for the single voltage transformer 22 of the coupler shown in FIG. 3. The current transformer 16 may also be replaced by a plurality of series-connected transformers if desired. Substitution of the plurality of transformers does not change the coupling factor of the device. Although using a plurality of series-connected transformers slightly increases the overall loss of the directional coupler due to the increased winding losses, the individual core losses are reduced since the cores and their resistive loss components are in series. Accordingly, the loss in each series-connected transformer is less than it would be for a single transformer. This is important at high power levels since it reduces the core cooling requirements.

Figure 4:
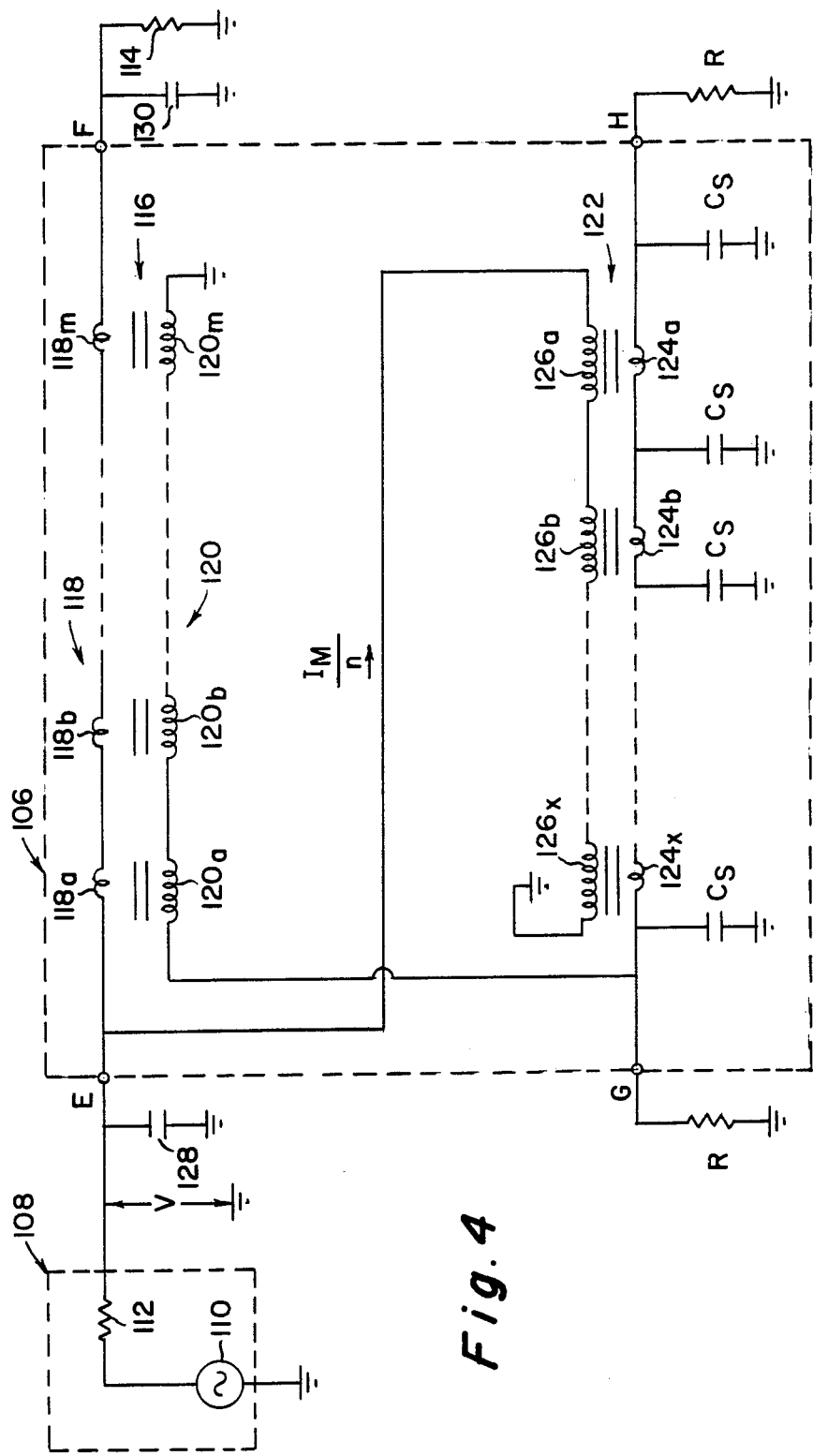
FIG. 4 is a schematic representation of the high frequency directional coupler according to the subject invention.

The series-connected multiple transformer HF directional coupler according to the present invention is shown in FIG. 4. The coupler 106 includes an input port E, an output port F, a reflected port G, and an incident port H. A power generator 108 including a source 110 and a source resistance 112 is connected with the coupler input port E to produce a voltage V thereacross. A load 114 is connected with the output port F, with resistances R being seen at the reflected and incident ports.

The coupler 106 comprises a current transformer 116 including at least one primary winding, and preferably a plurality of series-connected primary windings $118_a$, $118_b$ ... $118_m$ connected between the input port E and the output port F. The current transformer also includes at least one secondary winding, and preferably a plurality of series-connected secondary windings $120_a$, $120_b$ ... $120_m$ coupled with the current transformer primary windings, respectively. The series-connected secondary windings of the current transformer are connected between the reflected port G and ground.

The coupler 106 also comprises a voltage transformer 122 including a plurality of series-connected primary windings $124_a$, $124_b$ ... $124_x$ connected between the reflected port G and the incident port H, and a plurality of series-connected secondary windings $126_a$, $126_b$ ... $126_x$ coupled with the voltage transformer primary windings, respectively, and connected between the input port E and ground.

The current and voltage transformers 116, 122 each preferably include a nickel-zinc ferrite core.

As shown in FIG. 4, the plurality of series-connected windings for the primaries and secondaries of both the current and voltage transformers of the coupler are equivalent to providing multiple series-connected transformers for the current and voltage transformers. Like the transformers of the coupler of FIG. 3, the multiple series-connected transformers in the coupler of FIG. 4 have a 1:n turns ratio.

With x series-connected transformers for the voltage transformer of the coupler of FIG. 4, the voltage across each voltage transformer is V/x and thus, the flux density and distortion level in each core is reduced by a factor of x. Also, since there are x transformers in series, the magnetizing current $I_m$ is reduced by a factor of x, i.e. (Im/x). The total improvement in distortion should therefore be a factor of $x^2$ or 20 $\log_{10} x^2$ in dB. This theory was tested in 20 dB couplers using a single current transformer 116 and one, two and three series-connected voltage transformers for the voltage transformer 122. The calculated and measured intermodulation distortion (IMD) levels for the three test couplers are as follows:

| Number of Series-Connected Voltage Transformers | Measured Third Order IMD | Measured IMD Improvement | Calculated IMD Improvement (20 $\text{Log}_{10} x^2$) |
| --- | --- | --- | --- |
| 1 | −93.7 dB | | |
| 2 | −104.7 dB | 11.0 dB | 12 dB |
| 3 | −111.3 dB | 17.6 dB | 19 dB |

The close correlation between the measured intermodulation distortion performance and the calculated intermodulation distortion performance verifies the above theory. The cores used in the test couplers were small CMD 5005 nickel-zinc toroids. The use of larger cores with optimum shapes will result in lower distortion levels.

Series-connected multiple transformers can also improve the bandwidth of directional couplers. In a single section coupler, the main line (single turn) has an effective series inductance which is comprised of the leakage reactance, the loading of the secondary, and its own series inductive reactance. This effective series inductive reactance limits the overall bandwidth of the coupler in the main line.

The series inductance for a practical HF high power coupler is approximately 100 nh. In a 50 ohm system, this inductance would result in a 3 dB bandwidth of 159 MHz. The 0.05 dB bandwidth, however, with a VSWR OF 1.25 to 1, would only be 18 MHz. This is considered as a one pole network and is represented graphically in FIG. 5.

Figure 5:
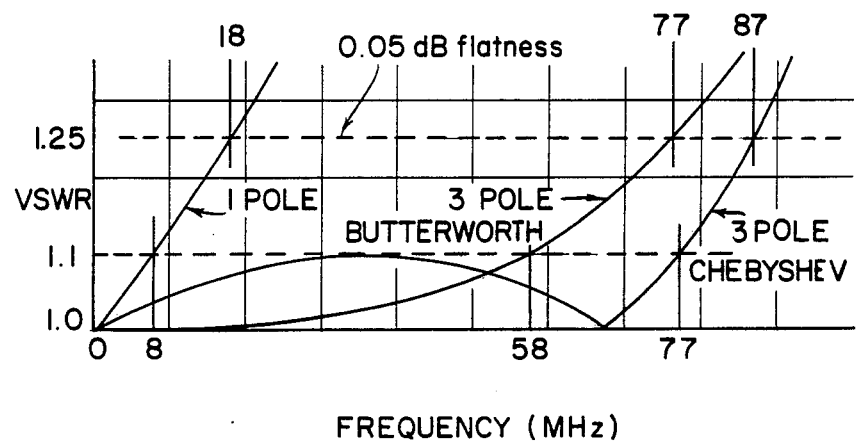
FIGS. 5 and 6 are graphical representations of voltage standing wave ratio (VSWR) vs. frequency for various filter networks.

If two physical capacitors of 20 pf are placed on the input and output of this effective series inductor, the network would be a three pole Butterworth low pass network, with a 3 dB bandwidth of 150 MHz. The 0.05 dB bandwidth would be approximately 77 MHz as shown in FIG. 5.

Accordingly, as shown in FIG. 4, a first capacitor 128 is connected between the input port E of the directional coupler 106 and ground, and a second capacitor 130 is connected between the output port F and ground. These capacitors increase the effective usable flat bandwidth from 18 to 77 MHz. When a certain amount of amplitude ripple is tolerated (0.01 dB ripple, 1.1 VSWR, 26 dB return loss), a Chebyshev network can be realized by changing the two shunt capacitors 128, 130 to 26 pf. The resulting 3 dB bandwidth would be lowered to 145 MHz, but the usable flat (0.05 dB) bandwidth would now increase to 87 MHz (0.01 dB bandwidth is 77 MHz) as shown in FIG. 5.

In accordance with the present invention, where there are a plurality of series-connected voltage transformer primary windings $124_a$, $124_b$ ... $124_x$, the overall flat bandwidth may be increased by the addition of shunt capacitors $C_s$ between the junction of adjacent windings and grounds and between the reflected and incident ports and ground as shown in FIG. 4. With three windings (i.e. x=3), four shunt capacitors are provided to form a seven pole low pass filter structure.

Figure 6:
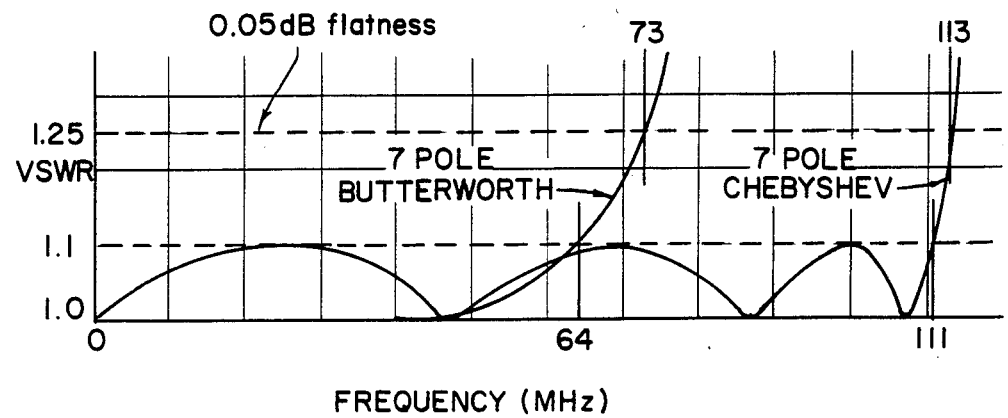

If an optimum flat response (Butterworth) is desired, the outer windings ($124_a$, $124_x$ shown in the drawing) can not be the same as the middle winding (i.e. $124_b$), but will determine the 3 dB bandwidth. Thus, for example, if windings $124_a$ and $124_x$ were the same 100 nh in a 50 ohm system, the winding $124_b$ would have to be 160 nh resulting in a 3 dB bandwidth of 99 MHz. The 0.05 bandwidth, however, would be 73 MHz (0.01 dB bandwidth=64 MHz) as shown in FIG. 6. The 0.01 dB Chebyshev case, however, has a distinct advantage. With the windings $124_a$ and $124_x$ still being the same limiting 100 nh and the winding $124_b$ being 117 nh, the 3 dB bandwidth is increased to 127 MHz, with a usable flat bandwidth (0.05 dB) of 113 MHz (0.01 dB bandwidth=111 MHz) as shown in FIG. 6.

Thus by using network synthesis techniques with the limiting 100 nh series inductance, the usable flat bandwidth has been increased from 18 MHz for the single pole network to 113 MHz for the seven pole structure. If the series inductance can be reduced, the overall bandwidth will be increased proportionately.

Accordingly, the addition of multiple series transformers to directional couplers to reduce the overall distortion does not create a problem with the overall bandwidth, as long as shunt capacitors are placed at the junctions as shown in FIG. 4 to form a low pass filter structure. With this technique, the overall flat bandwidth is increased, the windings can be made smaller, and heat losses are distributed more evenly.

While in accordance with the provisions of the Patent Statutes the preferred forms and embodiments of the invention have been illustrated and described, it will be apparent to those skilled in the art that various changes and modifications may be made without deviating from the inventive concepts set forth above.

What is claimed is:

1. A high frequency directional coupler, comprising
   (a) input, output, reflected, and incident ports;
   (b) current transformer means including at least one primary winding connected between said input and output ports and at least one secondary winding coupled with said current transformer primary winding and connected between said reflected port and ground; and (c) voltage transformer means including a plurality of series-connected primary windings connected between said reflected port and said incident port, and a plurality of series-connected secondary windings coupled with said voltage transformer primary windings, respectively, and connected between said input port and ground, whereby intermodulation distortion of the coupler is improved.

2. Apparatus as defined in claim 1, wherein said current transformer means includes a plurality of series-connected primary windings and a plurality of series-connected secondary windings.

3. Apparatus as defined in claim 2, and further comprising first capacitor means connected between said input port and ground and second capacitor means connected between said output port and ground, whereby the bandwidth of the coupler is increased.

4. Apparatus as defined in claim 3, wherein said voltage transformer means includes a plurality of shunting capacitor means, each of said shunting capacitor means being connected between the junction of a pair of said series-connected primary windings, respectively, and ground and between said reflected and incident ports and ground, thereby to define a low pass filter structure.

5. Apparatus as defined in claim 4, wherein said current and voltage transformer means each include a nickel-zinc ferrite core.

6. Apparatus as defined in claim 5, and further comprising a voltage source connected between said input port and ground.

* * * * *